(12) United States Patent
Shishida et al.

(10) Patent No.: US 8,384,208 B2
(45) Date of Patent: Feb. 26, 2013

(54) SEMICONDUCTOR DEVICE AND METHOD OF FABRICATING THE SAME

(75) Inventors: Yoshinori Shishida, Gifu (JP); Shinichi Chikaki, Tokyo (JP); Ryotaro Yagi, Shizuoka (JP); Kazuo Kohmura, Chiba (JP); Hirofumi Tanaka, Chiba (JP)

(73) Assignees: Sanyo Electric Co., Ltd., Osaka (JP); NEC Corporation, Tokyo (JP); Rohn Co., Ltd., Kyotto (JP)

( * ) Notice: Subject to any disclaimer, the term of this patent is extended or adjusted under 35 U.S.C. 154(b) by 0 days.

(21) Appl. No.: 11/826,093

(22) Filed: Jul. 12, 2007

(65) Prior Publication Data

US 2008/0050566 A1   Feb. 28, 2008

(30) Foreign Application Priority Data

Jul. 12, 2006   (JP) .................. 2006-191932

(51) Int. Cl.
*H01L 23/12* (2006.01)
*H01L 23/053* (2006.01)

(52) U.S. Cl. ........ 257/700; 257/758; 257/759; 257/760; 257/E23.145

(58) Field of Classification Search .............. None
See application file for complete search history.

(56) References Cited

U.S. PATENT DOCUMENTS

| | | | |
|---|---|---|---|
| 6,962,870 B2 | 11/2005 | Masuda et al. | |
| 7,030,468 B2 | 4/2006 | Gates et al. | |
| 7,282,458 B2 | 10/2007 | Gates et al. | |
| 7,531,891 B2 | 5/2009 | Ohto et al. | |
| 7,728,065 B2 | 6/2010 | Ozaki et al. | |
| 7,772,130 B2 | 8/2010 | Miyoshi et al. | |
| 7,830,012 B2 | 11/2010 | Ozaki et al. | |
| 2003/0211728 A1* | 11/2003 | Mandal | 438/633 |
| 2005/0029662 A1* | 2/2005 | Nakano et al. | 257/758 |
| 2005/0112998 A1 | 5/2005 | Matsuo et al. | |
| 2006/0001165 A1* | 1/2006 | Tokitoh et al. | 257/758 |
| 2006/0003577 A1* | 1/2006 | Sone | 438/638 |
| 2006/0160352 A1* | 7/2006 | Matsushita et al. | 438/622 |
| 2007/0085210 A1* | 4/2007 | Hsu et al. | 257/758 |
| 2007/0205507 A1* | 9/2007 | Chang et al. | 257/734 |

FOREIGN PATENT DOCUMENTS

| | | |
|---|---|---|
| JP | 2003-268356 | 9/2003 |
| JP | 2004-221498 | 8/2004 |
| JP | 2005-032750 | 2/2005 |

(Continued)

OTHER PUBLICATIONS

Japanese Office Action, with English translation, issued in Japanese Patent Application No. 2006-191932, mailed Mar. 22, 2011.

(Continued)

*Primary Examiner* — Benjamin Sandvik
*Assistant Examiner* — Leslie Pilar Cruz
(74) *Attorney, Agent, or Firm* — McDermott Will & Emery LLP

(57) ABSTRACT

A semiconductor device capable of improving a mechanical strength of a porous silica film while inhibiting a film located on a lower layer of the porous silica film from deterioration is obtained. This semiconductor device includes an organic film formed on a semiconductor substrate, an ultraviolet light permeation suppressive film, formed on a surface of the organic film, composed of a material which is difficult to be permeable by ultraviolet light, and a first porous silica film formed on a surface of the ultraviolet light permeation suppressive film.

6 Claims, 14 Drawing Sheets

FOREIGN PATENT DOCUMENTS

| | | |
|---|---|---|
| JP | 2005-131732 | 5/2005 |
| JP | 2005-166716 | 6/2005 |
| JP | 2005-203794 | 7/2005 |
| JP | 2005-223012 | 8/2005 |
| JP | 2005-272188 | 10/2005 |
| JP | 2007-220750 | 8/2007 |

OTHER PUBLICATIONS

Japanese Office Action, w/ English translation thereof, issued in Japanese Patent Application No. 2006-191932, dated Sep. 6, 2011.

* cited by examiner

SEMICONDUCTOR DEVICE AND METHOD OF FABRICATING THE SAME

BACKGROUND OF THE INVENTION

1. Field of the Invention

The present invention relates to a semiconductor device and a method of fabricating the same.

2. Description of the Background Art

A semiconductor device comprising an interlayer dielectric film is known in general. In such a semiconductor device comprising the interlayer dielectric film, a structure in which a low dielectric constant film is employed as the interlayer dielectric film has been considered in order to avoid delay of information transfer (RC delay) in a wire portion resulting from a parasitic capacitance of a wire formed on or under the interlayer dielectric film. The material of the low dielectric constant film includes a low dielectric constant film having a dielectric constant of around 2.7 such as an organic polymer material represented by polyaryl ether (PAE), or an SiOC material represented by hydrogen silsesquioxane (HSQ) or methyl silsesquioxane (MSQ) in addition to fluorinated silicate glass (FSG) having a dielectric constant of about 3.5 which has been relatively actually employed in general. In recent years, low dielectric constant films like a porous silica film having a dielectric constant of around 2.2 by making these porous have been attempted to be applied.

The aforementioned film having holes made porous, however, has a low mechanical strength, and hence it is required to improve a mechanical strength of portions other than the holes. A method for improving the mechanical strength of the porous silica film by performing a hardening treatment with ultraviolet light is proposed in Japanese Patent Laying-Open No. 2003-268356.

In the method proposed in Japanese Patent Laying-Open No. 2003-268356, however, ultraviolet light permeates through the porous silica film when the hardening treatment with ultraviolet light is performed, whereby in a case where a metal film such as Cu exists in a lower layer of the porous silica film, oxidation of the metal film is facilitated due to reaction of ultraviolet light and air. Thus, the resistance of the metal film is disadvantageously increased. In a case where the organic film such as a SiOC film exists in the lower layer of the porous silica film, desorption of hydrophobic groups such as —$CH_3$ groups contained in the organic film with ultraviolet light permeating through the porous silica film increases hygroscopicity, whereby dielectric constant of the organic film is disadvantageously increased.

SUMMARY OF THE INVENTION

The present invention has been proposed in order to solve the aforementioned problems, and an object of the present invention is to provide a semiconductor device capable of improving a mechanical strength of a porous silica film while inhibiting a film located on a lower layer of the porous silica film from deterioration.

A semiconductor device according to a first aspect of the present invention comprises an organic film formed on a semiconductor substrate, an ultraviolet light permeation suppressive film, formed on a surface of the organic film, composed of a material which is difficult to be permeable by ultraviolet light, and a first porous silica film formed on a surface of the ultraviolet light permeation suppressive film.

The semiconductor device according to the first aspect, as hereinabove described, the ultraviolet light permeation suppressive film composed of the material which is difficult to be permeable by ultraviolet light is provided on a lower layer of the first porous silica film, whereby the ultraviolet light permeation suppressive film can inhibit ultraviolet light from permeating through the lower layer of the ultraviolet light permeation suppressive film when the hardening treatment with ultraviolet light is performed on the first porous silica film in order to improve a mechanical strength of the first porous silica film. Thus, the film located on the lower layer of the first porous silica film can be inhibited from deterioration. Consequently, the mechanical strength of the first porous silica film can be improved while inhibiting the film located on the lower layer of the first porous silica film from deterioration.

In the aforementioned semiconductor device according to the first aspect, the ultraviolet light permeation suppressive film preferably includes a film suppressing permeation of a gas. According to this structure, ultraviolet light permeation suppressive film can conceivably inhibit hydrophobic groups such as —$CH_3$ groups degraded with ultraviolet light in the organic film located on the lower layer of the first porous silica film from desorbing as a gas from the organic film. Thus, increase in the hygroscopicity of the organic film can be suppressed, and hence increase in the dielectric constant of the organic film can be suppressed. The aforementioned point has been confirmed by experiments conducted by the inventor of the present application described later.

In the aforementioned semiconductor device according to the first aspect, the ultraviolet light permeation suppressive film preferably includes an SiCN film. According to this structure, the SiCN film, which is the material suppressing permeation of ultraviolet light and the material suppressing permeation of a gas, is employed as the ultraviolet light permeation suppressive film, whereby permeation of ultraviolet light to the lower layer can be easily suppressed and the hydrophobic group such as the —$CH_3$ group can be inhibited from being desorbed as a gas from the organic film located on the lower layer of the SiCN film.

In the aforementioned semiconductor device according to the first aspect, the organic film preferably includes an opening, and the semiconductor device further comprises a wiring layer formed at least inside the opening of the organic film under the ultraviolet light permeation suppressive film. According to this structure, the wiring layer is formed on a lower layer of the ultraviolet light permeation suppressive film, whereby permeation of ultraviolet light to the wiring layer can be suppressed when hardening treatment with ultraviolet light is performed on the first porous silica film. Thus, oxidation of the wiring layer can be inhibited from being facilitated due to reaction with air by permeation of ultraviolet light to the wiring layer.

In this case, a barrier metal is preferably formed between the opening of the organic film and the wiring layer. According to this structure, component of the organic film and the wiring layer can be easily inhibited from diffusing between the organic film and the wiring layer.

In the aforementioned semiconductor device in which the organic film includes the opening, the opening is preferably so formed as to penetrate the organic film, the ultraviolet light permeation suppressive film and the first porous silica film. According to this structure, the wiring layer reaching the semiconductor substrate under the organic film from the first porous silica film can be easily formed.

In the aforementioned semiconductor device according to the first aspect, the organic film formed under the ultraviolet light permeation suppressive film preferably includes a second porous silica film and a cap film composed of SiOC, formed between the second porous silica film and the ultraviolet light permeation suppressive film. According to this structure, in a case where a resist film is formed on a surface of the first porous silica film formed on the surface of the ultraviolet light permeation suppressive film and the opening reaching the second porous silica film from the first porous silica film is formed, for example, the cap film is formed on a surface of the second porous silica film and hence active species (ion, radical, etc.) produced when removing a resist film can be inhibited from penetrating into the second porous silica film. Thus, the second porous silica film can be inhibited from being damaged.

In the aforementioned semiconductor device according to the first aspect, the thickness of the ultraviolet light permeation suppressive film is preferably so formed as to be smaller than the thickness of the organic film and the thickness of the first porous silica film. According to this structure, dielectric constant of the ultraviolet light permeation suppressive film can be easily reduced as compared with a case where the thickness of the ultraviolet light permeation suppressive film is so formed as to be larger than the thickness of the organic film and the thickness of the first porous silica film.

A method of fabricating a semiconductor device according to a second aspect of the present invention comprises steps of forming an organic film on a semiconductor substrate, forming an ultraviolet light permeation suppressive film composed of a material which is difficult to be permeable by ultraviolet light on a surface of the organic film, forming a first porous silica film on a surface of the ultraviolet light permeation suppressive film, and irradiating the first porous silica film with ultraviolet light.

In the method of fabricating a semiconductor device according to the second aspect, as hereinabove described, the ultraviolet light permeation suppressive film composed of the material which is difficult to be permeable by ultraviolet light is formed on the surface of the organic film, the first porous silica film is formed on the surface of the ultraviolet light permeation suppressive film, and thereafter the first porous silica film is irradiated with ultraviolet light, whereby the ultraviolet light permeation suppressive film can inhibit ultraviolet light from permeating through the lower layer of the ultraviolet light permeation suppressive film when the hardening treatment with ultraviolet light is performed on the first porous silica film in order to improve a mechanical strength of the first porous silica film. Thus, the film located on the lower layer of the first porous silica film can be inhibited from deterioration. Consequently, the mechanical strength of the first porous silica film can be improved while inhibiting the film located on the lower layer of the first porous silica film from deterioration.

In the aforementioned method of fabricating a semiconductor device according to the second aspect, the ultraviolet light permeation suppressive film preferably includes a film suppressing permeation of a gas. According to this structure, ultraviolet light permeation suppressive film can conceivably inhibit hydrophobic groups such as —$CH_3$ groups degraded with ultraviolet light in the organic film located on the lower layer of the first porous silica film from desorbing as a gas from the organic film. Thus, increase in the hygroscopicity of the organic film can be suppressed, and hence increase in the dielectric constant of the organic film can be suppressed. The aforementioned point has been confirmed by experiments conducted by the inventor of the present application described later.

In the aforementioned method of fabricating a semiconductor device according to the second aspect, the ultraviolet light permeation suppressive film preferably includes an SiCN film. According to this structure, the SiCN film, which is the material suppressing permeation of ultraviolet light and the material suppressing permeation of a gas, is employed as the ultraviolet light permeation suppressive film, whereby permeation of ultraviolet light to the lower layer can be easily suppressed and hydrophobic groups such as —$CH_3$ groups can be inhibited from being desorbed as a gas from the organic film located on the lower layer of the SiCN film.

The aforementioned method of fabricating a semiconductor device according to the second aspect preferably further comprises a step of forming an opening in the organic film after irradiating the first porous silica film with ultraviolet light. According to this structure, the organic film is irradiated with ultraviolet light in a state of covering the same with ultraviolet light permeation suppressive film dissimilarly to a case of irradiating the same with ultraviolet light after forming the opening, whereby the organic film can be inhibited from being damaged due to ultraviolet light.

In this case, the method of fabricating a semiconductor device preferably further comprises a step of forming a wiring layer at least inside the opening of the organic film. According to this structure, the wiring layer reaching the semiconductor substrate can be easily formed.

The aforementioned method of fabricating a semiconductor device including the step of forming the wiring layer at least inside the opening of the organic film preferably further comprises a step of forming a barrier metal between the opening and the wiring layer. According to this structure, component of the organic film and wiring layer can be easily inhibited from diffusing between the organic film and the wiring layer.

The aforementioned method of fabricating a semiconductor device including the step of forming the opening in the organic film preferably further comprises a step of forming the opening so as to penetrating the organic film, the ultraviolet light permeation suppressive film and the first porous silica film. According to this structure, the wiring layer reaching the semiconductor substrate under the organic film from the first porous silica film can be easily formed.

The aforementioned method of fabricating a semiconductor device according to the second aspect preferably further comprises forming an opening after forming the organic film, forming a wiring layer in the opening, and forming the ultraviolet light permeation suppressive film so as to cover surfaces of the organic film and the wiring layer. According to this structure, in a case where the first porous silica film is formed on the surface of the ultraviolet light permeation suppressive film and thereafter is irradiated with ultraviolet light, for example, the wiring layer is covered with the ultraviolet light permeation suppressive film and hence the wiring layer can be inhibited from being damaged due to ultraviolet light.

In the aforementioned method of fabricating a semiconductor device according to the second aspect, the organic film preferably includes a second porous silica film and a cap film composed of SiOC, formed between the second porous silica film and the ultraviolet light permeation suppressive film, and the semiconductor device further comprises a step of forming an opening in the organic film after forming the cap film. According to this structure, in a case where a resist film is formed on a surface of the first porous silica film formed on the surface of the ultraviolet light permeation suppressive film and the opening reaching the second porous silica film from the first porous silica film is formed, for example, the cap film is formed on a surface of the second porous silica film and hence active species (ion, radical, etc.) produced when removing the resist film can be inhibited from penetrating into the second porous silica film. Thus, the second porous silica film can be inhibited from being damaged.

The aforementioned method of fabricating a semiconductor device according to the second aspect preferably further comprises a step of irradiating the first porous silica film with ultraviolet light and thereafter performing calcination treatment on the same under a 1,3,5,7-Tetramethylcyclotetrasiloxane atmosphere. According to this structure, the surface of the first porous silica film can be covered with hydrophobic groups, whereby it is possible to inhibit $H_2O$ (water) from adhering to the first porous silica film. Thus, it is possible to suppress increase in the dielectric constant of the first porous silica film resulting from adhesion of $H_2O$ (water) to the first porous silica film.

In the aforementioned method of fabricating a semiconductor device according to the second aspect, the step of forming the ultraviolet light permeation suppressive film preferably includes a step of forming the thickness of the ultraviolet light permeation suppressive film so as to be smaller than the thickness of the organic film and the thickness of the first porous silica film. According to this structure, dielectric constant of the ultraviolet light permeation suppressive film can be easily reduced as compared with a case where the thickness of the ultraviolet light permeation suppressive film is so formed as to be larger than the thickness of the organic film and the thickness of the first porous silica film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be hereinafter described with reference to the drawings.

First Embodiment

A structure of a semiconductor device comprising a porous silica film according to a first embodiment of the present invention will be now described with reference to FIG. 1.

Figure 1:
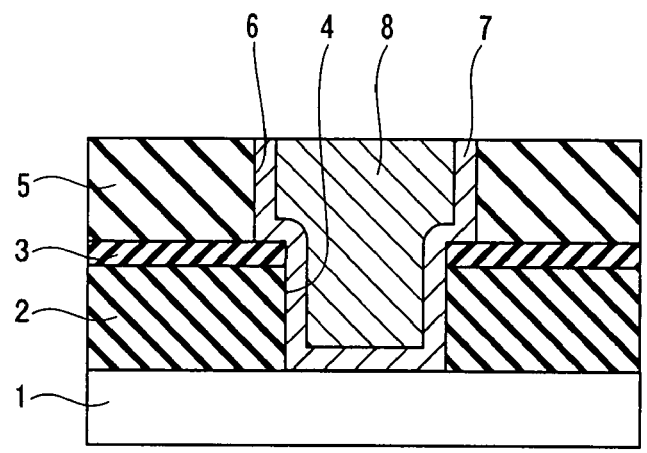
FIG. 1 is a sectional view showing a structure of a semiconductor device comprising a porous silica film according to a first embodiment of the present invention.

In the semiconductor device according to the first embodiment, an SiOC film 2 having a thickness of about 130 nm is formed on a silicon substrate 1 as shown in FIG. 1. The silicon substrate 1 is an example of the "semiconductor substrate" in the present invention and the SiOC film 2 is an example of the "organic film" in the present invention. An ultraviolet light permeation suppressive film 3 consisting of a SiCN film having a thickness of about 30 nm is formed on the SiOC film 2. This ultraviolet light permeation suppressive film 3 of SiCN is hardly permeable by ultraviolet light. The ultraviolet light permeation suppressive film 3 of SiCN is further hardly permeable by a gas. A via hole 4, circular in plan view, having a depth reaching an upper surface of the silicon substrate 1 is formed through the SiOC film 2 and the ultraviolet light permeation suppressive film 3. The via hole 4 is an example of the "opening" in the present invention.

According to the first embodiment, a porous silica film 5 having a thickness of about 130 nm is formed on the ultraviolet light permeation suppressive film 3. The porous silica film 5 is an example of the "first porous silica film" in the present invention. A groove 6 partially bottomed by an upper surface of the ultraviolet light permeation suppressive film 3 is formed through the porous silica film 5. The groove 6 has a width not less than the diameter of the via hole 4 in plan view. The groove 6 is an example of the "opening" in the present invention.

A barrier metal layer 7 is formed along inner surfaces of the via hole 4 and the groove 6. This barrier metal layer 7 is in a multilayer structure of a lower TaN layer having a thickness of about 15 nm and an upper Ta layer also having a thickness of about 15 nm. On the region located inside the via hole 4 and the groove 6, further, a wiring layer 8 of Cu is formed on an inner surface of the barrier metal layer 7, to fill up the via hole 4 and the groove 6.

A process of fabricating the semiconductor device according to the first embodiment will be now described with reference to FIGS. 1 to 6.

Figure 2:
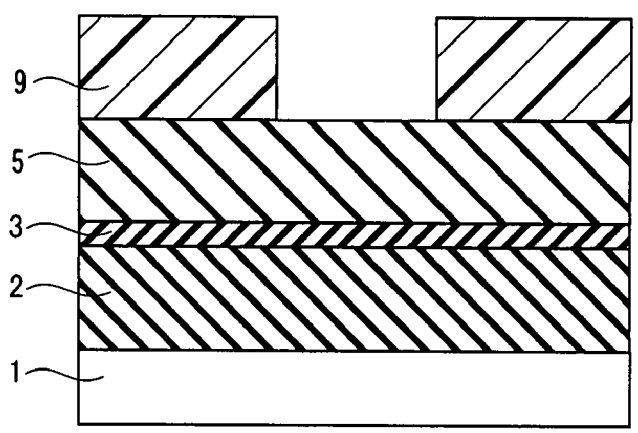
FIGS. 2 to 6 are sectional views for illustrating a process of fabricating the semiconductor device comprising the porous silica film according to the first embodiment of the present invention.

First, as shown in FIG. 2, the SiOC film 2 having a thickness of about 130 nm is formed on the silicon substrate 1 by plasma CVD (chemical vapor deposition). At this time, a parallel plate type plasma CVD apparatus is employed as a plasma CVD apparatus. DMDMOS (dimethyldimethoxysilane) gas and He gas are employed as reaction gases with flow rates set to about 200 sccm and about 120 sccm respectively. The scccm is an abbreviation of Standard cc/min and a measure representing a flow rate per minute at a normal state (0° C., 1 atm) with cc. Further, a chamber pressure, a substrate temperature, power applied to an electrode on which no substrate is set, a power frequency and an interelectrode distance are set to about 560 Pa, about 350° C., about 1000 W, about 27.12 MHz and about 20 mm respectively.

Then, the ultraviolet light permeation suppressive film 3 of the SiCN film having a thickness of about 30 nm is formed on the SiOC film 2 by plasma CVD. At this time, the parallel plate type plasma CVD apparatus is employed as a plasma CVD apparatus. 4MS (tetramethylsilane) gas, $NH_3$ (ammonia) gas and He gas are employed as reaction gases with flow rates set to about 0.38 slpm, about 0.38 slpm and about 5.25 slpm respectively. The slpm is an abbreviation of standard liter/min and a measure representing a flow rate per minute at a normal state (0° C., 1 atm) with liter. Further, a chamber pressure and a substrate temperature are set to about 665 Pa and about 380° C. respectively, while power applied to an electrode on which no substrate is set (a power frequency), power applied to an electrode on which a substrate is set (a power frequency), and an interelectrode distance are set to about 850 W (about 27.12 MHz), about 125 W (about 400 kHz) and about 22.775 mm respectively.

A precursor solution for the porous silica film 5 is applied onto the ultraviolet light permeation suppressive film 3 by spin coating. This precursor solution consists of tetraethoxysilane (TEOS), water, acid and alcohol. Thereafter the precursor solution applied onto the ultraviolet light permeation suppressive film 3 is annealed with a hot plate and thereafter calcined under a nitrogen atmosphere and a 1,3,5,7-Tetramethylcyclotetrasiloxane (TMCTS) atmosphere under a temperature condition of about 350° C. Thus, the porous silica film 5 having a thickness of about 130 nm is formed on the ultraviolet light permeation suppressive film 3. Hardening treatment of the porous silica film 5 is performed by irradiating the porous silica film 5 for 10 minutes with ultraviolet light having a wavelength of 172 nm at an intensity of 14 $mW/cm^2$ under an atmosphere of a pressure of 10 Pa and a substrate temperature of 350° C. Calcination treatment is further performed under a temperature condition of about 350° C. under a TMCTS atmosphere again. This calcination treatment with TMCTS is performed for inhibiting $H_2O$ (water) from adhering to the surface of the porous silica film 5 by covering the surface of the porous silica film 5 with hydrophobic groups. Thus, it is possible to suppress increase in the dielectric constant of the porous silica film 5 resulting from adhesion of $H_2O$ (water) to the surface of the porous silica film 5.

Figure 3:
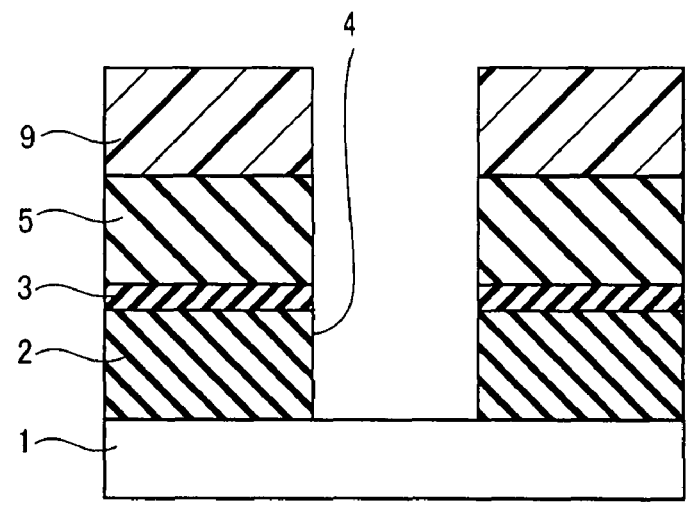

As shown in FIG. 2, a resist film 9 is formed on a prescribed region of the porous silica film 5. Then, as shown in FIG. 3, the porous silica film 5, the ultraviolet light permeation suppressive film 3 of SiCN and the SiOC film 2 are etched by RIE (reactive ion etching) through the resist film 9 serving as a mask, to partially expose the upper surface of the silicon substrate 1. As a condition for performing etching, $CF_4$ gas is employed as a reaction gas with a flow rate and a pressure set to about 200 sccm and about 1 Pa respectively, and plasma power is set to about 800 W under a frequency of about 450 MHz. Further, a wafer bias (bias power for the silicon substrate 1) is set to about 200 W under a frequency of about 800 kHz, and a substrate temperature of the silicon substrate 1 is set to about 50° C. Thus, the via hole 4 bottomed by the upper surface of the silicon substrate 1 is formed by this etching. Thereafter ashing is performed to remove the resist film 9. As a condition for performing this ashing, $NH_3$ gas is employed as a reaction gas with a flow rate and a pressure set to about 200 sccm and about 2 Pa respectively, and plasma power is set to about 1400 W under a frequency of about 450 MHz. Further, a wafer bias is set to about 200 W under a frequency of about 800 kHz, and a substrate temperature of the silicon substrate 1 is set to about 50° C.

Figure 4:
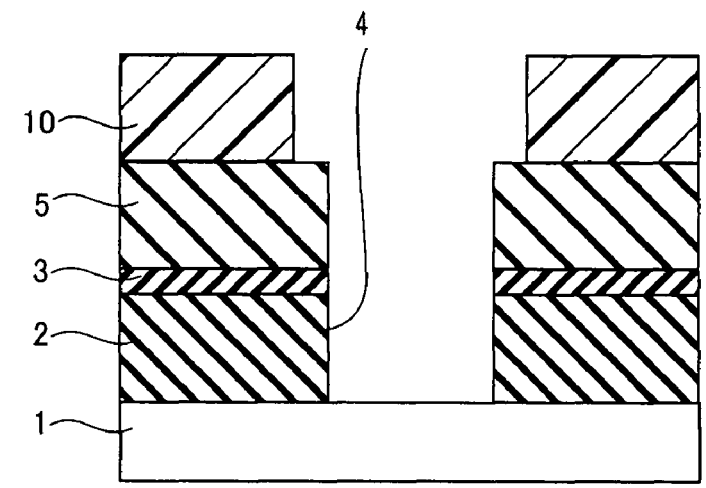
Figure 5:
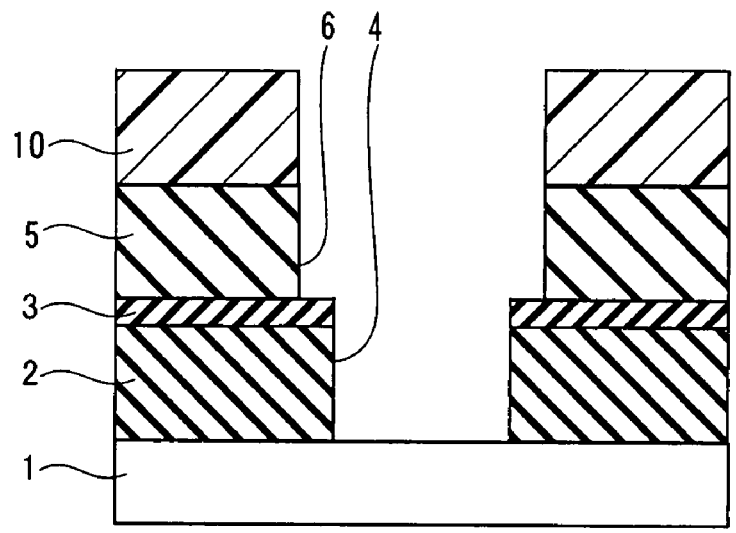

As shown in FIG. 4, a resist film 10 is formed on a prescribed region of the porous silica film 5. Then, as shown in FIG. 5, the porous silica film 5 is etched by RIE through the resist film 10 serving as a mask and thereafter ashing is performed to remove the resist film 10, thereby forming the groove 6 in the porous silica film 5. Etching and ashing conditions in this case are the same as the aforementioned Etching and ashing conditions for forming the via hole 4.

Figure 6:
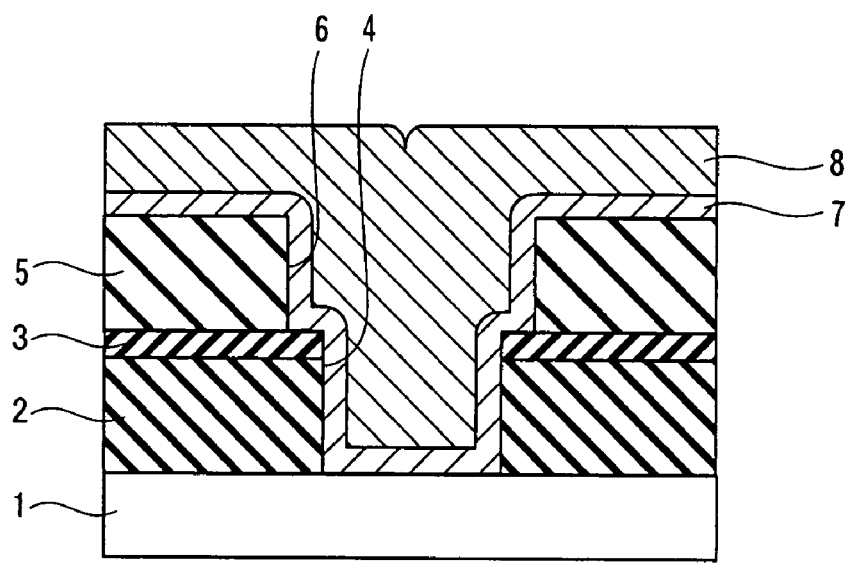

As shown in FIG. 6, the barrier metal layer 7 is formed on the upper surface of the porous silica film 5, the inner surfaces of the groove 6 and the via hole 4 by sputtering. This barrier metal layer 7 is prepared by successively forming the TaN layer having the thickness of about 15 nm and the Ta layer having the thickness of about 15 nm. Thereafter a seed layer (not shown) of Cu for plating is formed on the barrier metal layer 7 by sputtering. Then, Cu is deposited on the seed layer (not shown) by electroplating. Thus, the wiring layer 8 of Cu is formed on the seed layer to fill up the groove 6 and the via hole 4.

The wiring layer 8 and the barrier metal layer 7 are thereafter polished by CMP (chemical mechanical polishing) from above the upper surface of the wiring layer 8 until the upper surfaces of the barrier metal layer 7 and the wiring layer 8 coincide with the upper surface of the porous silica film 5, whereby the semiconductor device according to the first embodiment as shown in FIG. 1 is formed.

According to the first embodiment, as hereinabove described, the ultraviolet light permeation suppressive film 3 consisting of SiCN is provided on the lower layer of the porous silica film 5, whereby the ultraviolet light permeation suppressive film 3 can inhibit ultraviolet light from permeating through the lower layer of the ultraviolet light permeation suppressive film 3 when the hardening treatment with ultraviolet light is performed on the porous silica film 5 in order to improve a mechanical strength of the porous silica film 5. Thus, the SiOC film 2 located on the lower layer of the porous silica film 5 can be inhibited from deterioration. Consequently, the mechanical strength of the porous silica film 5 can be improved while inhibiting the SiOC film 2 located on the lower layer of the porous silica film 5 from deterioration.

According to the first embodiment, as hereinabove described, the ultraviolet light permeation suppressive film 3 of SiCN having a function of suppressing permeation of gas in addition to a function of suppressing permeation of ultraviolet light is employed as the ultraviolet light permeation suppressive film 3, whereby the ultraviolet light permeation suppressive film 3 of SiCN can conceivably inhibit hydrophobic groups such as —$CH_3$ groups degraded with ultraviolet light in the SiOC film 2 located on the lower layer of the porous silica film 5 from desorbing as a gas from the SiOC film 2. Thus, increase in the hygroscopicity of the SiOC film 2 can be suppressed, and hence increase in the dielectric constant of the SiOC film 2 can be suppressed. The aforementioned point has been confirmed by experiments conducted by the inventor of the present application described later.

Second Embodiment

Figure 7:
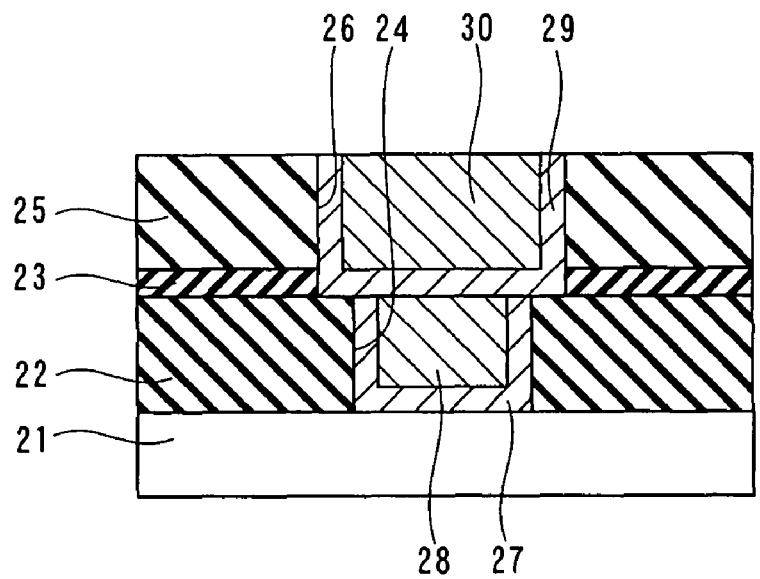
FIG. 7 is a sectional view showing a structure of a semiconductor device comprising a porous silica film according to a second embodiment of the present invention.

Referring to FIG. 7, in a semiconductor device according to a second embodiment, wiring layers 28 and 30 are separately formed in a via hole 24 and a groove 26 respectively dissimilarly to the semiconductor device according to the aforementioned first embodiment.

In the semiconductor device according to the second embodiment, an SiOC film 22 having a thickness of about 130 nm is formed on a silicon substrate 21 as shown in FIG. 7. The silicon substrate 21 is an example of the "semiconductor substrate" in the present invention and the SiOC film 22 is an example of the "organic film" in the present invention. An ultraviolet light permeation suppressive film 23 consisting of a SiCN film having a thickness of about 30 nm is formed on the SiOC film 22. This ultraviolet light permeation suppressive film 23 of SiCN is hardly permeable by ultraviolet light. A via hole 4, circular in plan view, having a depth reaching an upper surface of the silicon substrate 21 is formed through the SiOC film 22. The via hole 24 is an example of the "opening" in the present invention.

According to the second embodiment, a porous silica film 25 having a thickness of about 130 nm is formed on the ultraviolet light permeation suppressive film 23. The porous silica film 25 is an example of the "first porous silica film" in the present invention. The groove 26 partially bottomed by an upper surface of the SiOC film 22 is formed through the porous silica film 25. The groove 26 has a width not less than the diameter of the via hole 24 in plan view. The groove 26 is an example of the "opening" in the present invention.

A barrier metal layer 27 which is in a multilayer structure of a lower TaN layer having a thickness of about 15 nm and an upper Ta layer also having a thickness of about 15 nm is formed along an inner surface of the via hole 24. On the region located inside the via hole 24, further, the wiring layer 28 of Cu is formed on an inner surface of the barrier metal layer 27, to fill up the via hole 24.

A barrier metal layer 29 is formed on an inner surface of the groove 26, the upper surface of the SiOC film 22 constituting the bottom of the groove 26 and upper surfaces of the barrier metal layer 27 and the wiring layer 28. This barrier metal layer 29 is in a multilayer structure of a lower TaN layer having a thickness of about 15 nm and an upper Ta layer also having a thickness of about 15 nm. On the region located inside the groove 26, further, the wiring layer 30 of Cu is formed on an inner surface of the barrier metal layer 29, to fill up the groove 26.

A process of fabricating the semiconductor device according to the second embodiment will be now described with reference to FIGS. 7 to 15.

Figure 8:
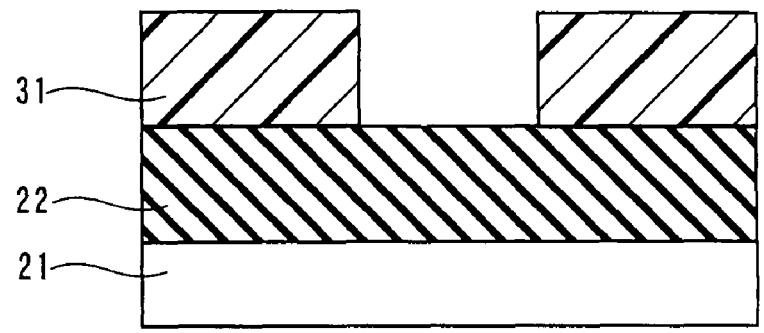
FIGS. 8 to 15 are sectional views for illustrating a process of fabricating the semiconductor device comprising the porous silica film according to the second embodiment of the present invention.

First, as shown in FIG. 8, the SiOC film 22 having a thickness of about 130 nm is formed on the silicon substrate 1 by plasma CVD. At this time, a parallel plate type plasma CVD apparatus is employed as a plasma CVD apparatus. DMDMOS gas and He gas are employed as reaction gases with flow rates set to about 200 sccm and about 120 sccm respectively. Further, a chamber pressure, a substrate temperature, power applied to an electrode on which no substrate is set, a power frequency and an interelectrode distance are set to about 560 Pa, about 350° C., about 1000 W, about 27.12 MHz and about 20 mm respectively.

Figure 9:
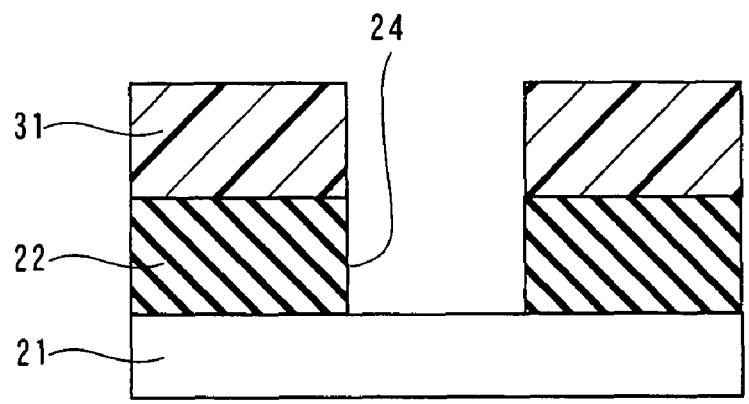

As shown in FIG. 8, a resist film 31 is formed on a prescribed region of the SiOC film 22. Then, as shown in FIG. 9, the SiOC film 22 is etched by RIE through the resist film 31 serving as a mask, to partially expose the upper surface of the silicon substrate 21. As a condition for performing etching, $CF_4$ gas is employed as a reaction gas with a flow rate and a pressure set to about 200 sccm and about 1 Pa respectively, and plasma power is set to about 800 W under a frequency of about 450 MHz. Further, a wafer bias (bias power for the silicon substrate 21) is set to about 200 W under a frequency of about 800 kHz, and the temperature of the silicon substrate 21 is set to about 50° C. Thus, the via hole 24 bottomed by the upper surface of the silicon substrate 21 is formed by this etching. Thereafter ashing is performed to remove the resist film 31. As a condition for performing this ashing, $NH_3$ gas is employed as a reaction gas with a flow rate and a pressure set to about 200 sccm and about 2 Pa respectively, and plasma power is set to about 1400 W under a frequency of about 450 MHz. Further, a wafer bias is set to about 200 W under a frequency of about 800 kHz, and the temperature of the silicon substrate 21 is set to about 50° C.

Figure 10:
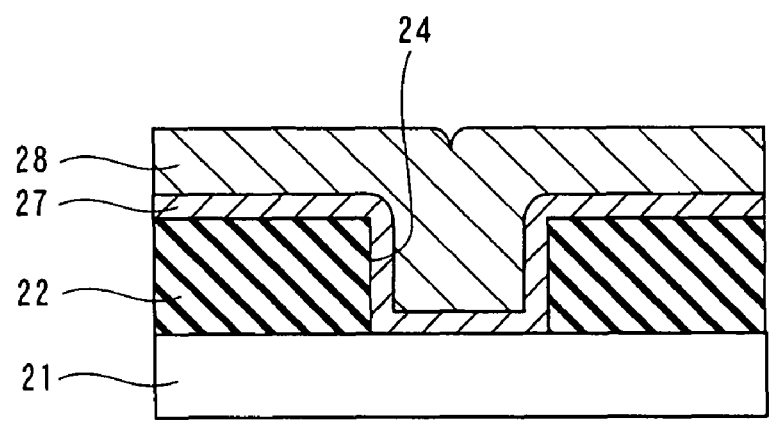

As shown in FIG. 10, the barrier metal layer 27 is formed on the inner surface of the via hole 24 and the upper surface of SiOC film 22 by sputtering. This barrier metal layer 27 is prepared by successively forming the TaN layer having the thickness of about 15 nm and the Ta layer having the thickness of about 15 nm. Thereafter a seed layer (not shown) of Cu for plating is formed on the barrier metal layer 27 by sputtering.

Figure 11:
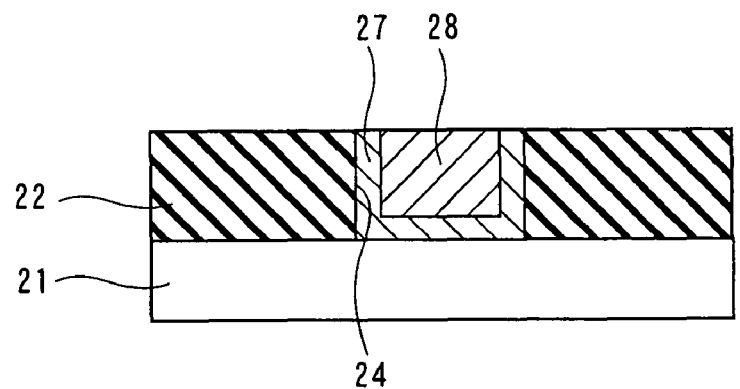

Then, Cu is deposited on the seed layer (not shown) by electroplating. Thus, the wiring layer 28 of Cu is formed on the seed layer to fill up the via hole 24. The wiring layer 28 and the barrier metal layer 27 are thereafter polished by CMP from above the upper surface of the wiring layer 28 until the upper surfaces of the barrier metal layer 27 and the wiring layer 28 coincide with the upper surface of the SiOC film 22 as shown in FIG. 11.

Figure 12:
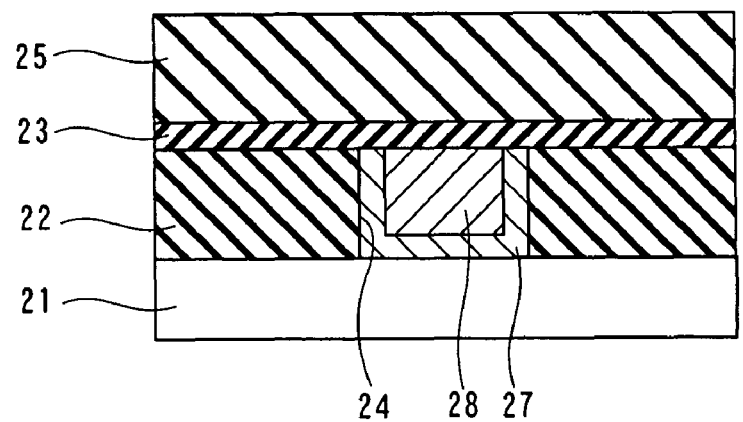

As shown in FIG. 12, the ultraviolet light permeation suppressive film 23 of the SiCN film having a thickness of about 30 nm is formed on the SiOC film 22, the barrier metal layer 27 and the wiring layer 28 by plasma CVD. At this time, the parallel plate type plasma CVD apparatus is employed as a plasma CVD apparatus. 4MS gas, $NH_3$ gas and He gas are employed as reaction gases with flow rates set to about 0.38 slpm, about 0.38 slpm and about 5.25 slpm respectively. Further, a chamber pressure and a substrate temperature are set to about 665 Pa and about 380° C. respectively, while power applied to an electrode on which no substrate is set (a power frequency), power applied to an electrode on which a substrate is set (a power frequency) and an interelectrode distance are set to about 850 W (about 27.12 MHz), about 125 W (about 400 kHz) and about 22.775 mm respectively.

A precursor solution for the porous silica film 25 is applied onto the ultraviolet light permeation suppressive film 23 by spin coating. This precursor solution consists of tetraethoxysilane (TEOS), water, acid and alcohol. Thereafter the precursor solution applied onto the ultraviolet light permeation suppressive film 23 is annealed with a hot plate and thereafter calcined under a nitrogen atmosphere and a TMCTS atmosphere under a temperature condition of about 350° C. Thus, the porous silica film 25 having a thickness of about 130 nm is formed on the ultraviolet light permeation suppressive film 23. Hardening treatment of the porous silica film 25 is performed by irradiating the porous silica film 25 for 10 minutes with ultraviolet light having a wavelength of 172 nm at an intensity of 14 mW/cm$^2$ under an atmosphere of a pressure of 10 Pa and a substrate temperature of 350° C. Calcination treatment is further performed under a temperature condition of about 350° C. under a TMCTS atmosphere again. This calcination treatment with TMCTS is performed for inhibiting $H_2O$ (water) from adhering to the surface of the porous silica film 25 by covering the surface of the porous silica film 25 with hydrophobic groups. Thus, it is possible to suppress increase in the dielectric constant of the porous silica film 25 resulting from adhesion of $H_2O$ (water) to the surface of the porous silica film 25.

Figure 13:
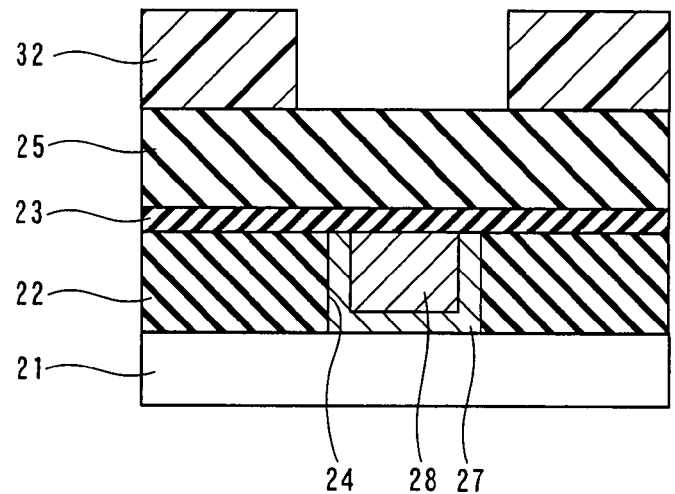
Figure 14:
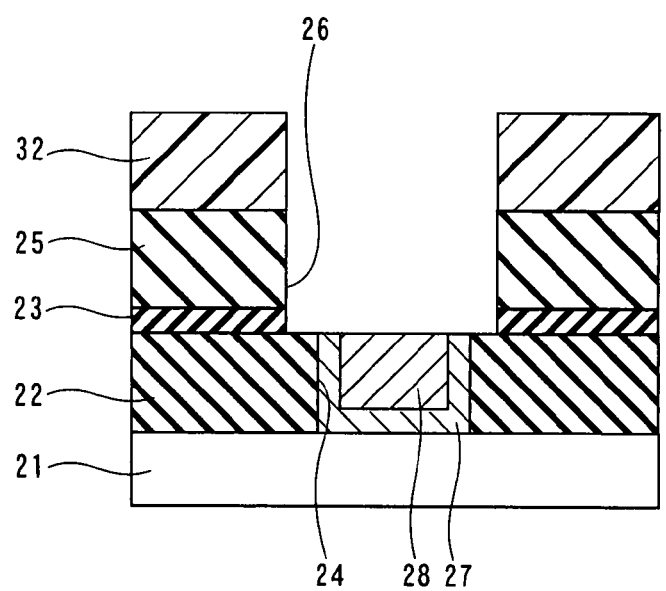

As shown in FIG. 13, a resist film 32 is formed on a prescribed region of the porous silica film 25. Then, as shown in FIG. 14, the porous silica film 25 and the ultraviolet light permeation suppressive film 23 of SiCN are etched by RIE through the resist film 32 serving as a mask, to expose a part of the upper surface of the SiOC film 22 and the upper surfaces of the barrier metal layer 27 and the wiring layer 28. As a condition for performing etching, $CF_4$ gas is employed as a reaction gas with a flow rate and a pressure set to about 200 sccm and about 1 Pa respectively, and plasma power is set to about 800 W under a frequency of about 450 MHz. Further, a wafer bias (bias power for the silicon substrate 21) is set to about 200 W under a frequency of about 800 kHz, and the temperature of the silicon substrate 21 is set to about 50° C. Thus, the groove 26 bottomed by a part of the upper surface of the SiOC film 22 and the upper surfaces of the barrier metal layer 27 and the wiring layer 28 is formed by this etching. Thereafter ashing is performed to remove the resist film 32. As a condition for performing this ashing, $NH_3$ gas is employed as a reaction gas with a flow rate and a pressure set to about 200 sccm and about 2 Pa respectively, and plasma power is set to about 1400 W under a frequency of about 450 MHz. Further, a wafer bias is set to about 200 W under a frequency of about 800 kHz, and the temperature of the silicon substrate 21 is set to about 50° C.

Figure 15:
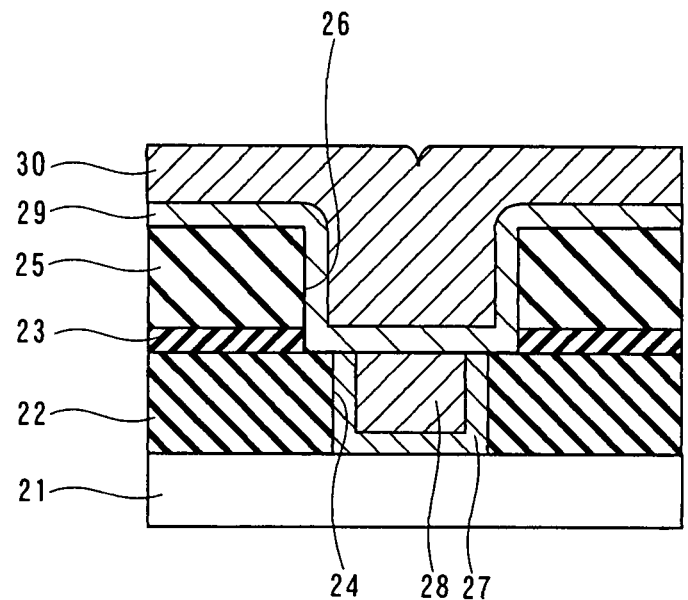

As shown in FIG. 15, the barrier metal layer 29 is formed on the inner surface of the groove 26 and the upper surface of porous silica film 25 by sputtering. This barrier metal layer 29 is prepared by successively forming the TaN layer having the thickness of about 15 nm and the Ta layer also having the thickness of about 15 nm. Thereafter a seed layer (not shown) of Cu for plating is formed on the barrier metal layer 29 by sputtering. Then, Cu is deposited on the seed layer (not shown) by electroplating. Thus, the wiring layer 30 of Cu is formed on the seed layer to fill up the groove 26. The wiring layer 30 and the barrier metal layer 29 are thereafter polished by CMP from above the upper surface of the wiring layer 30 until the upper surfaces of the barrier metal layer 29 and the wiring layer 30 coincide with the upper surface of the porous silica film 25, whereby the semiconductor device according to the second embodiment as shown in FIG. 7 is formed.

According to the second embodiment, as hereinabove described, the wiring layer 28 is formed on a lower layer of the ultraviolet light permeation suppressive film 23, whereby the ultraviolet light permeation suppressive film 23 can inhibit ultraviolet light from permeating through the wiring layer 28 when hardening treatment with ultraviolet light is performed on the porous silica film 25. Thus, oxidation of the wiring layer 28 can be inhibited from being facilitated due to reaction with air by permeation of ultraviolet light to the wiring layer 28.

The remaining effects of the second embodiment are similar to those of the aforementioned first embodiment.

Third Embodiment

Figure 16:
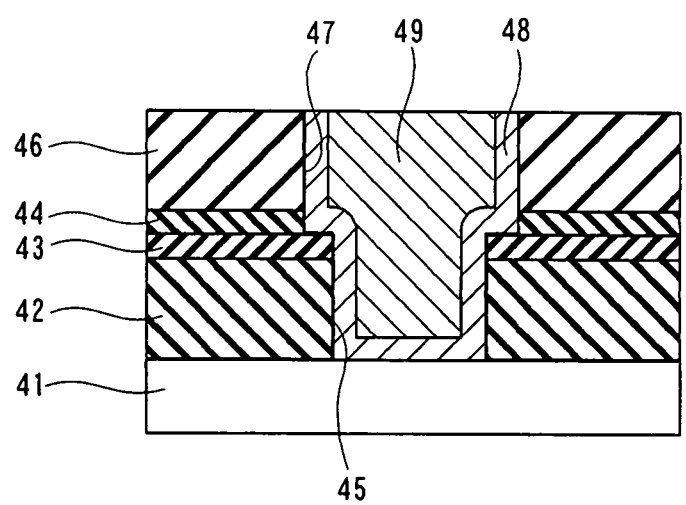
FIG. 16 is a sectional view showing a structure of a semiconductor device comprising a porous silica film according to a third embodiment of the present invention.

Referring to FIG. 16, in a semiconductor device according to the third embodiment, a porous silica film 42 is employed as an organic film located under an ultraviolet light permeation suppressive film 44 consisting of a SiCN film and a SiOC film 43 as a cap film is provided between the porous silica film 42 as the organic film and the ultraviolet light permeation suppressive film 44 of the SiCN dissimilarly to the semiconductor devices according to the aforementioned first and second embodiments.

In the semiconductor device according to the third embodiment, the porous silica film 42 as the organic film having a thickness of about 130 nm is formed on a silicon substrate 41 as shown in FIG. 16. The silicon substrate 41 is an example of the "semiconductor substrate" in the present invention. The SiOC film 43 as the cap film having a thickness of about 30 nm is formed on the porous silica film 42. The porous silica film 42 is an example of the "second porous silica film" in the present invention. The SiOC film 43 is an example of the "cap film" in the present invention. The porous silica film 42 and the SiOC film 43 constitute the "organic film" in the present invention. The SiOC film 43 as the cap film has a function of inhibiting the porous silica film 42 located on a lower layer from being damaged when removing the resist film 51 by ashing. Further, the ultraviolet light permeation suppressive film 44 of SiCN having a thickness of about 30 nm is formed on the SiOC film 43. This ultraviolet light permeation suppressive film 44 of SiCN is hardly permeable by ultraviolet light and gas similarly to the aforementioned first embodiment. A via hole 45, circular in plan view, having a depth reaching an upper surface of the silicon substrate 41 is formed through the porous silica film 42 and the SiOC film 43. The via hole 45 is an example of the "opening" in the present invention.

According to the third embodiment, a porous silica film 46 having a thickness of about 130 nm is formed on the ultraviolet light permeation suppressive film 44. The porous silica film 46 is an example of the first porous silica film in the present invention. A groove 47 partially bottomed by an upper surface of the SiOC film 43 is formed through the porous silica film 46 and the ultraviolet light permeation suppressive film 44. The groove 47 has a width not less than the diameter of the via hole 45 in plan view. The groove 47 is an example of the "opening" in the present invention.

On the regions located inside the via hole 45 and the groove 47, a barrier metal layer 48 having a shape reflecting the shapes of the via hole 45 and the groove 47 is formed on an upper surface corresponding to the via hole 45 of the silicon substrate 41. This barrier metal layer 48 is in a multilayer structure of a lower TaN layer having a thickness of about 15 nm and an upper Ta layer also having a thickness of about 15 nm. On the region located inside the via hole 45 and the groove 47, further, a wiring layer 49 of Cu is formed on an inner surface of the barrier metal layer 48, to fill up the via hole 45 and the groove 47.

A process of fabricating the semiconductor device according to the third embodiment will be now described with reference to FIGS. 16 to 21.

Figure 17:
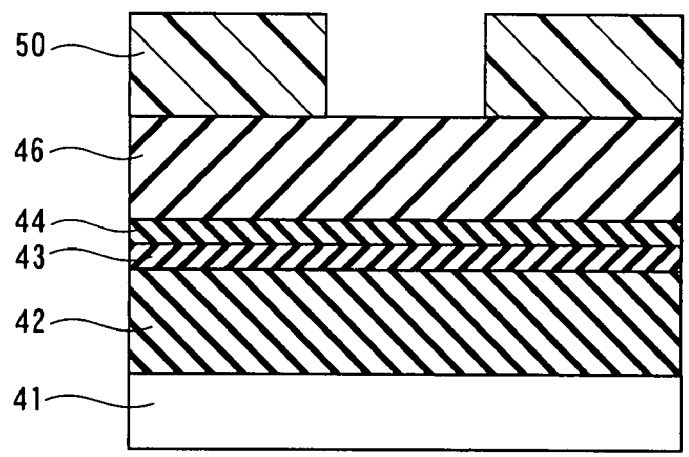
FIGS. 17 to 21 are sectional views for illustrating a process of fabricating the semiconductor device comprising the porous silica film according to the third embodiment of the present invention.

As shown in FIG. 17, a precursor solution for the porous silica film 42 is applied onto the silicon substrate 41 by spin coating. This precursor solution consists of tetraethoxysilane (TEOS), water, acid and alcohol. Thereafter the precursor solution applied onto the silicon substrate 41 is annealed with a hot plate and thereafter calcined under a nitrogen atmosphere and a TMCTS atmosphere under a temperature condition of about 350° C. Thus, the porous silica film 42 having a thickness of about 130 nm is formed on the silicon substrate 41. This calcination treatment with TMCTS is performed for inhibiting $H_2O$ (water) from adhering to the surface of the porous silica film 42 by covering the surface of the porous silica film 42 with hydrophobic groups. Thus, it is possible to suppress increase in the dielectric constant of the porous silica film 42 resulting from adhesion of $H_2O$ (water) to the surface of the porous silica film 42.

Then, the SiOC film 43 having a thickness of about 30 nm is formed on the porous silica film 42 by plasma CVD. At this time, a parallel plate type plasma CVD apparatus is employed as a plasma CVD apparatus. DMDMOS gas and He gas are employed as reaction gases with flow rates set to about 200 sccm and about 120 sccm respectively. Further, a chamber pressure, a substrate temperature, power applied to an electrode on which no substrate is set, a power frequency and an interelectrode distance are set to about 560 Pa, about 350° C., about 1000 W, about 27.12 MHz and about 20 mm respectively.

The ultraviolet light permeation suppressive film 44 of the SiCN film having a thickness of about 30 nm is formed on the SiOC film 43 by plasma CVD. At this time, the parallel plate type plasma CVD apparatus is employed as a plasma CVD apparatus. 4MS gas, $NH_3$ gas and He gas are employed as reaction gases with flow rates set to about 0.38 slpm, about 0.38 slpm and about 5.25 slpm respectively. Further, a chamber pressure and a substrate temperature are set to about 665 Pa and about 380° C. respectively, while power applied to an electrode on which no substrate is set (a power frequency), power applied to an electrode on which a substrate is set (a power frequency), and an interelectrode distance are set to about 850 W (about 27.12 MHz), about 125 W (about 400 kHz) and about 22.775 mm respectively.

A precursor solution for the porous silica film 46 is applied onto the ultraviolet light permeation suppressive film 44 of SiCN by spin coating. This precursor solution consists of tetraethoxysilane (TEOS), water, acid and alcohol. Thereafter the precursor solution applied onto the ultraviolet light permeation suppressive film 44 is annealed with a hot plate and thereafter calcined under a nitrogen atmosphere and a TMCTS atmosphere under a temperature condition of about 350° C. Thus, the porous silica film 46 having a thickness of about 130 nm is formed on the ultraviolet light permeation suppressive film 44. Hardening treatment of the porous silica film 46 is performed by irradiating the porous silica film 46 for 10 minutes with ultraviolet light having a wavelength of 172 nm at an intensity of 14 mW/cm$^2$ under an atmosphere of a pressure of 10 Pa and a substrate temperature of 350° C. Calcination treatment is further performed under a temperature condition of about 350° C. under a TMCTS atmosphere again. This calcination treatment with TMCTS is performed for inhibiting $H_2O$ (water) from adhering to the surface of the porous silica film 46 by covering the surface of the porous silica film 46 with hydrophobic groups. Thus, it is possible to suppress increase in the dielectric constant of the porous silica film 46 resulting from adhesion of $H_2O$ (water) to the surface of the porous silica film 46.

Figure 18:
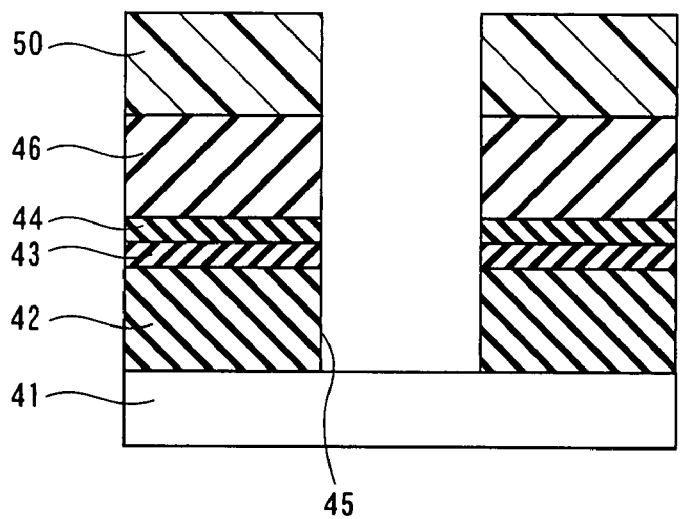

As shown in FIG. 17, a resist film 50 is formed on a prescribed region of the porous silica film 46. Then, as shown in FIG. 18, the porous silica film 46, the ultraviolet light permeation suppressive film 44 of SiCN, the SiOC film 43 and the porous silica film 42 are etched by RIE through the resist film 50 serving as a mask, to partially expose the upper surface of the silicon substrate 41. As a condition for performing etching, $CF_4$ gas is employed as a reaction gas with a flow rate and a pressure set to about 200 sccm and about 1 Pa respectively, and plasma power is set to about 800 W under a frequency of about 450 MHz. Further, a wafer bias (bias power for the silicon substrate 21) is set to about 200 W under a frequency of about 800 kHz, and the temperature of the silicon substrate 41 is set to about 50° C. Thus, the via hole 45 bottomed by the upper surface of the silicon 41 is formed by this etching. Thereafter ashing is performed to remove the resist film 50. As a condition for performing this ashing, $NH_3$ gas is employed as a reaction gas with a flow rate and a pressure set to about 200 sccm and about 2 Pa respectively, and plasma power is set to about 1400 W under a frequency of about 450 MHz. Further, a wafer bias is set to about 200 W under a frequency of about 800 kHz, and the temperature of the silicon substrate 41 is set to about 50° C.

Figure 19:
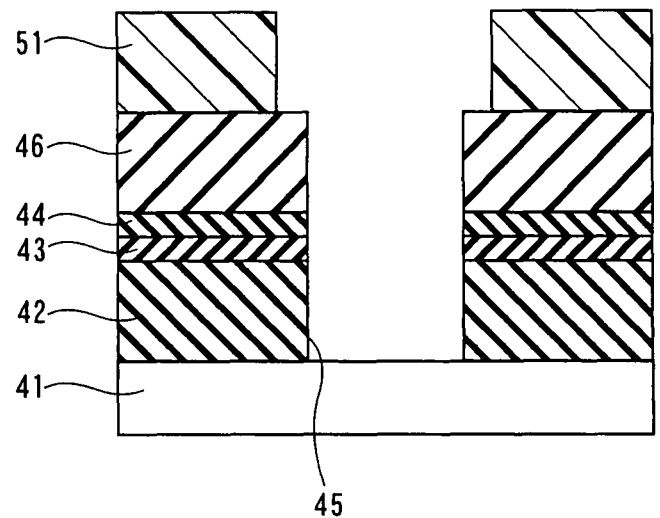
Figure 20:
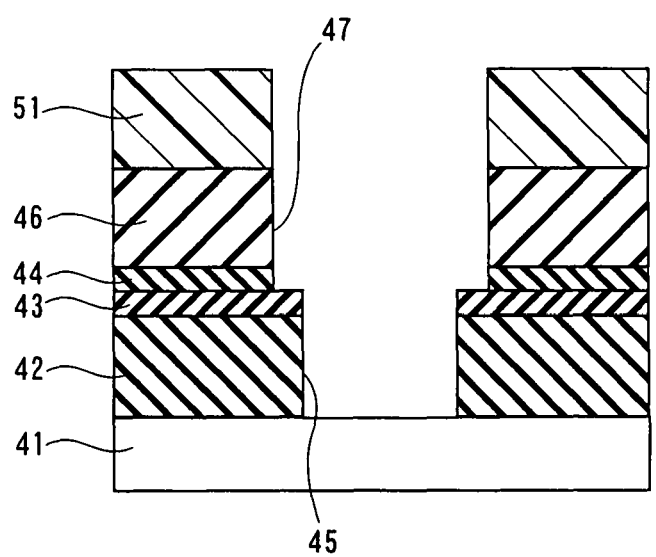

As shown in FIG. 19, a resist film 51 is formed on a prescribed region of the porous silica film 46. Then, as shown in FIG. 20, the porous silica film 46 and the ultraviolet light permeation suppressive film 44 of SiCN are etched by RIE through the resist film 51 serving as a mask and thereafter ashing is performed to remove the resist film 51, thereby forming the groove 47 in the porous silica film 46. Etching and ashing conditions in this case are the same as the aforementioned Etching and ashing conditions for forming the via hole 45.

Figure 21:
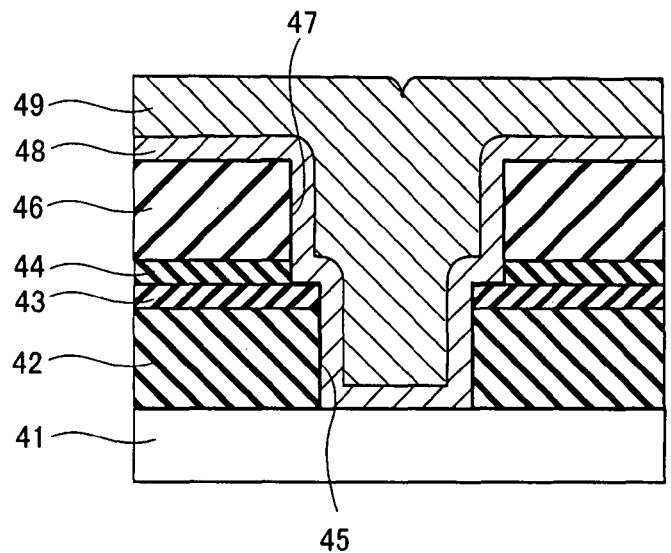

As shown in FIG. 21, the barrier metal layer 48 is formed on the upper surface of the porous silica film 46, the inner surfaces of the groove 47 and the via hole 45 by sputtering. This barrier metal layer 48 is prepared by successively forming the TaN layer having the thickness of about 15 nm and the Ta layer also having the thickness of about 15 nm. Thereafter a seed layer (not shown) of Cu for plating is formed on a surface of the barrier metal layer 48 by sputtering. Then, Cu is deposited on the seed layer (not shown) by electroplating. Thus, the wiring layer 49 of Cu is formed on the seed layer to fill up the groove 47 and the via hole 45.

The wiring layer 49 and the barrier metal layer 48 are thereafter polished by CMP from above the upper surface of the wiring layer 49 until the upper surfaces of the barrier metal layer 48 and the wiring layer 49 coincide with the upper surface of the porous silica film 46, whereby the semiconductor device according to the third embodiment as shown in FIG. 16 is formed.

According to the third embodiment, as hereinabove described, the ultraviolet light permeation suppressive film 44 of SiCN is provided on the lower layer of the porous silica film 46, whereby the ultraviolet light permeation suppressive film 44 can inhibit ultraviolet light from permeating through the lower layer of the ultraviolet light permeation suppressive film 44 when the hardening treatment with ultraviolet light is performed on the porous silica film 46 in order to improve a mechanical strength of the porous silica film 46. Thus, the SiOC film 43 as the cap layer located on the lower layer of the porous silica film 46 can be inhibited from deterioration. Consequently, the mechanical strength of the porous silica film 46 can be improved while inhibiting the film located on the lower layer of the porous silica film 46 from deterioration.

According to the third embodiment, as hereinabove described, the SiOC film 43 as the cap film is provided on the lower layer of the ultraviolet light permeation suppressive film 44 of SiCN, whereby the SiOC film 43 as the cap film inhibits active species (ion, radical, etc.) produced when removing the resist film 51 by ashing from penetrating into the porous silica film 42. Thus, the porous silica film 42 located on the lower layer of the SiOC film 43 can be inhibited from being damaged.

The remaining effects of the third embodiment are similar to those of the aforementioned first embodiment.

Experiment 1

Experiment 1 conducted for confirming the aforementioned effect of the ultraviolet light permeation suppressive films consisting of the SiCN films according to the first to third embodiments will be now described with reference to FIGS. 22 to 25. Samples each prepared by forming at least one of a SiOC film and a SiCN film on a silicon substrate by plasma CVD were employed in this experiment 1. As a condition for forming the SiOC film when forming each sample, a parallel plate type plasma CVD apparatus was employed as a plasma CVD apparatus. DMDMOS gas and He gas were employed as reaction gases with flow rates set to about 200 sccm and about 120 sccm respectively. Further, a chamber pressure, a substrate temperature, power applied to an electrode on which no substrate was set, a power frequency and an interelectrode distance were set to about 560 Pa, about 350° C., about 1000 W, about 27.12 MHz and about 20 mm respectively.

As a condition for forming the SiCN film when forming each sample, the parallel plate type plasma CVD apparatus was employed as a plasma CVD apparatus. 4MS gas, $NH_3$ gas and He gas were employed as reaction gases with flow rates set to about 0.38 slpm, about 0.38 slpm and about 5.25 slpm respectively. Further, a chamber pressure and a substrate temperature were set to about 665 Pa and about 380° C. respectively, while power applied to an electrode on which no substrate was set (a power frequency), power applied to an electrode on which a substrate is set (a power frequency), and an interelectrode distance were set to about 850 W (about 27.12 MHz), about 125 W (about 400 kHz) and about 22.775 mm respectively. As hereinabove described, samples prepared were irradiated with ultraviolet light having a wavelength of 172 nm at an intensity of 14 mW/cm² under an atmosphere of a pressure of 10 Pa and a substrate temperature of 350° C.

Figure 22:
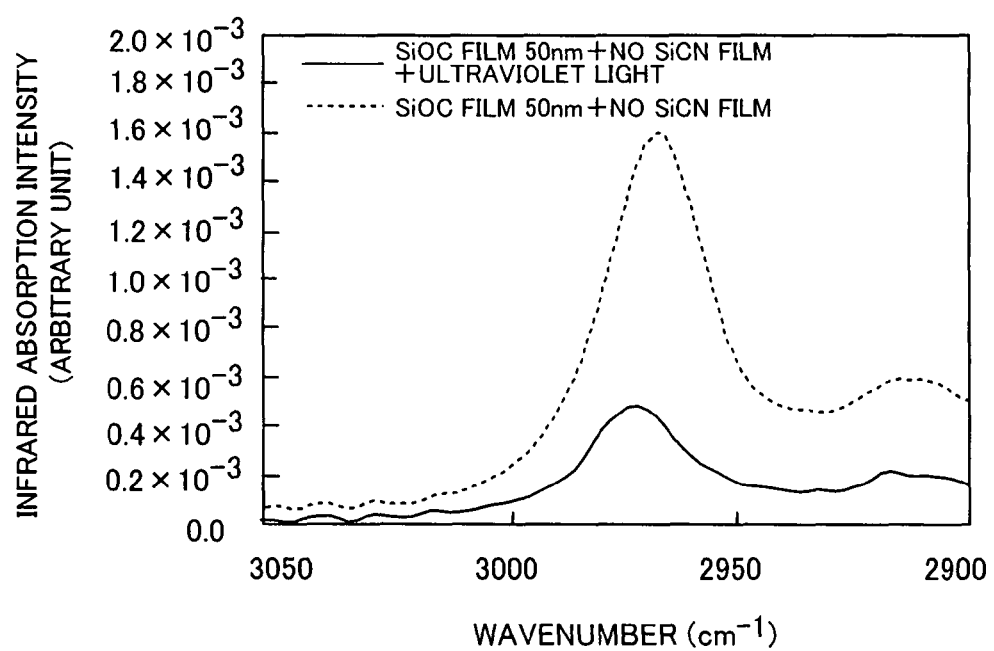
FIG. 22 is a graph showing results of SiOC films measured with a FT-IR in a case of forming no SiCN films on the SiOC films.
Figure 23:
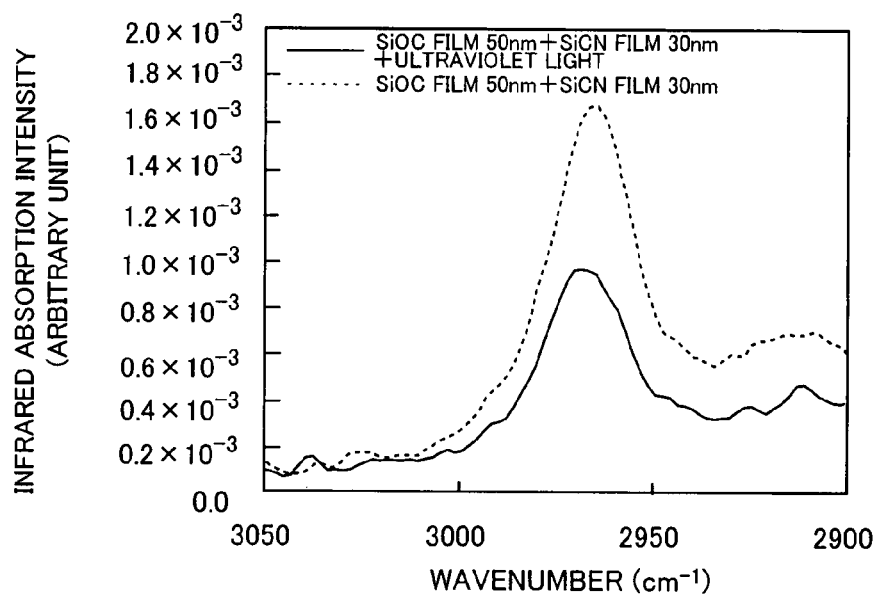
FIG. 23 is a graph showing results of SiOC films measured with the FT-IR in a case of forming SiCN films on the SiOC films.

FIGS. 22 and 23 show spectra measured with a FT-IR (Fourier transform infrared spectroscopic analysis) before and after irradiating a sample prepared by forming only a SiOC film having a thickness of 50 nm on a surface of the silicon substrate with forming no SiCN film on the SiOC film and a sample prepared by successively forming a SiOC film having a thickness of 50 nm and a SiCN film having a thickness of 30 nm on the silicon substrate for 10 minutes with ultraviolet light respectively. The FT-IR is a device irradiating a sample to be measured with infrared ray and measuring absorptance (infrared absorption intensity) for wavelength from infrared ray having permeated or reflected and infrared ray having irradiated. Each spectrum shown in FIGS. 22 and 23 is a spectrum of the SiOC film only by removing absorption by the SiCN film and the silicon substrate. In the sample prepared by forming no SiCN film on the SiOC film, as shown in FIG. 22, it is understood that absorption by —$CH_3$ groups appearing around a wavenumber of 2960 (cm⁻¹) by irradiation with ultraviolet light is reduced. In other words, it is understood that the —$CH_3$ groups desorb from the SiOC film due to influence of ultraviolet light to be reduced in the sample prepared by forming no SiCN film on the SiOC film. Also in the sample prepared by forming the SiCN film having a thickness of 30 nm on the SiOC film, as shown in FIG. 23, it is understood that absorption by the —$CH_3$ groups appearing around a wavenumber of 2960 (cm⁻¹) by irradiation with ultraviolet light is reduced. It has also been proved that the ratio of reduction of the —$CH_3$ groups in the sample prepared by forming the SiCN film having a thickness of 30 nm on the SiOC film (see FIG. 23) is small as compared with the ratio of the reduction of the —$CH_3$ groups in the sample prepared by forming no SiCN film (see FIG. 22). Thus, it has been possible to confirm that the SiCN film can suppress the desorption of the —$CH_3$ groups due to the influence of the ultraviolet light. The —$CH_3$ group is a hydrophobic group and hence can inhibit moisture from being incorporated into the organic film. Consequently, the SiCN film has a function of inhibiting the dielectric constant of the organic film from increase.

Figure 24:
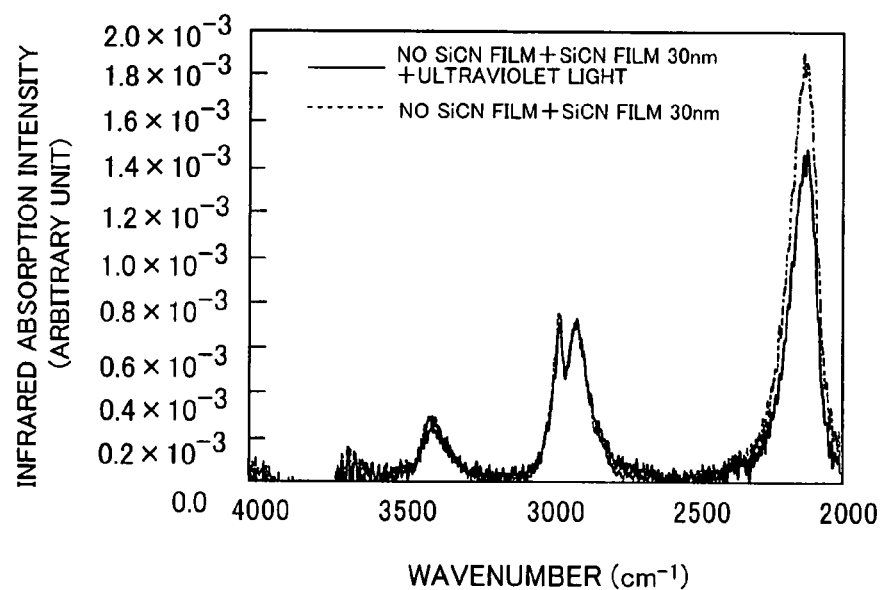
FIG. 24 is a graph showing results of SiCN films measured with the FT-IR before and after irradiation of ultraviolet light.

FIG. 24 shows spectra measured with the FT-IR before and after irradiating a sample prepared by forming a SiCN film with 30 nm on a surface of a silicon substrate without forming a SiOC film for 10 minutes with ultraviolet light. As shown in FIG. 24, in the sample prepared by forming only the SiCN film on the silicon substrate without forming the SiOC film, it has been proved that although Si—H groups around a wavenumber of 2180 (cm⁻¹) is slightly reduced, no major change does not appear in other regions and the —$CH_3$ groups particularly around a wavenumber of 2960 (cm⁻¹) remains substantially unchanged before and after the irradiation with ultraviolet light. Thus, the irradiation of ultraviolet light conceivably does not greatly influence the —$CH_3$ groups in the SiCN film functioning as the ultraviolet light permeation suppressive film, and hence influence of deterioration of the SiCN film (ultraviolet light permeation suppressive film) due to irradiation of ultraviolet light is conceivably small.

Figure 25:
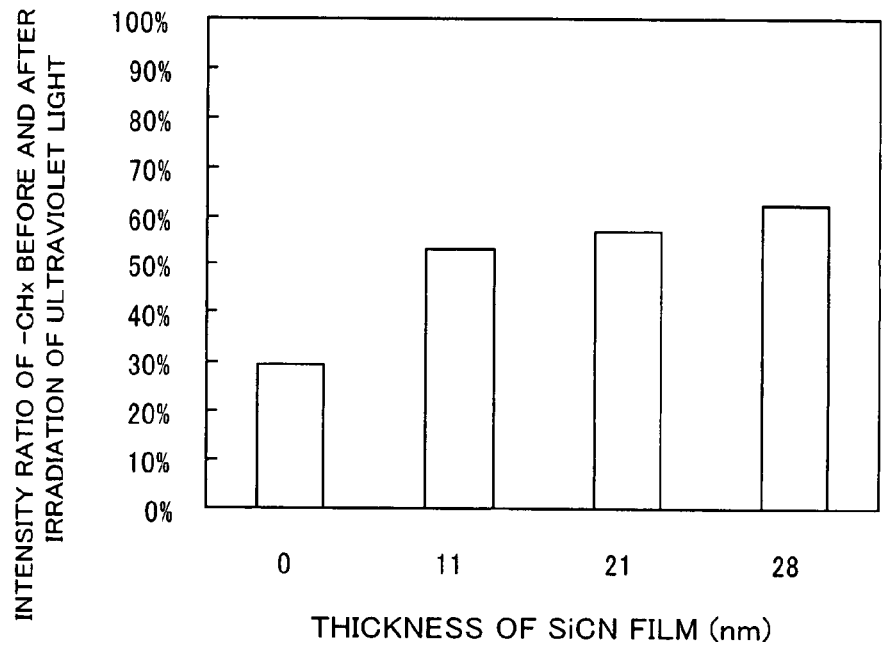
FIG. 25 is a graph showing infrared absorption intensities of —$CH_x$ groups in SiOC films before and after irradiation of ultraviolet light with respect to four types of SiCN film thicknesses.

FIG. 25 shows results measured with the FT-IR before and after irradiating four types of samples prepared by forming SiCN films with thicknesses of 0 nm, about 10 nm, about 22 nm and about 30 nm after forming SiOC films with thicknesses of 50 nm on surfaces of silicon substrates for 10 minutes with ultraviolet light. In FIG. 25, the axis of abscissa shows the thicknesses of the SiCN films, and the axis of ordinate shows ratios of infrared absorption intensities of —$CH_x$ groups after irradiation of ultraviolet light with respect to infrared absorption intensities before irradiation of ultraviolet light. Each infrared absorption intensity of the —$CH_x$ groups is calculated by accumulating infrared absorption intensity having a wavenumber of 2750 to 3050 (cm⁻¹). It is understood from FIG. 25 that the lager the thickness of the SiCN film, the larger the intensity ratio of the —$CH_x$ groups after irradiation of ultraviolet light with respect to those before irradiation of ultraviolet light. This means that the lager the thickness of the SiCN film, the smaller the desorption of the —$CH_x$ groups due to the irradiation of ultraviolet light. Consequently, it has been proved that permeation of the ultraviolet light can be suppressed, as the thickness of the SiCN film is larger.

Experiment 2

Experiment 2 conducted for confirming the aforementioned ultraviolet light permeability with respect to the SiOC films and the SiCN films will be now described with reference to FIGS. 26 and 27. Three types of samples prepared by forming the SiOC film with thicknesses of 0 nm, about 34 nm and about 102 nm on quarts substrates by plasma CVD and three types of samples prepared by forming the SiCN film with thicknesses of 0 nm, about 36 nm and about 106 nm on quarts substrates by plasma CVD were employed in this experiment 2. A condition for forming the SiOC film and the SiCN film in each sample of this experiment 2 is the same as that of the aforementioned experiment 1.

Figure 26:
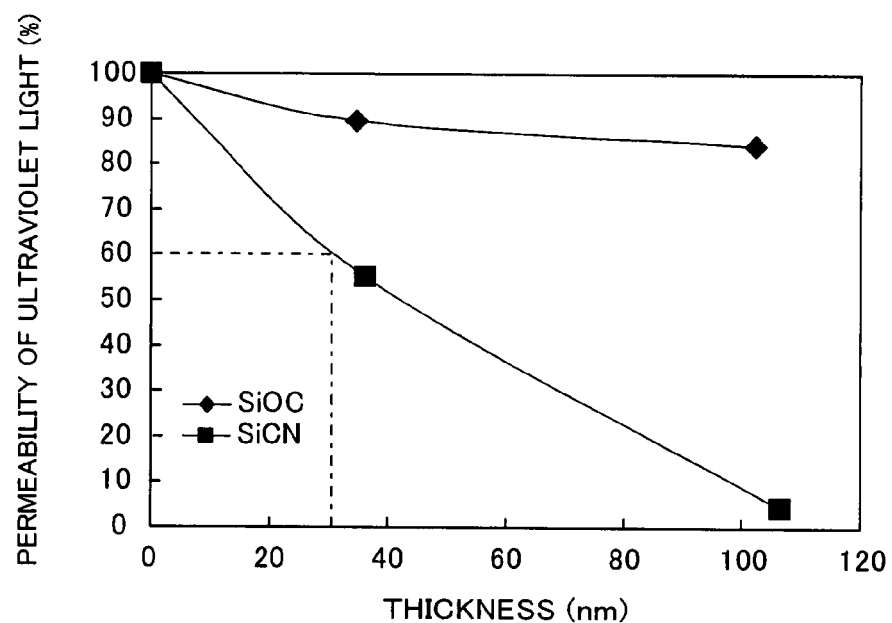
FIG. 26 is a graph showing ultraviolet light permeability with respect to thicknesses of SiOC films and SiCN films when irradiated with ultraviolet light.

FIG. 26 shows ultraviolet light permeability with respect to respective film thicknesses when the samples prepared by forming the SiOC films on the quarts substrates and when the samples prepared by forming the SiCN film on the quarts substrates. It has been proved that permeability of the SiOC film with a thickness of about 102 nm is about 84%, while permeability of the SiCN film with a thickness of about 106 nm is about 4%. Thus, it is possible to confirm that the SiCN film can suppress permeation of ultraviolet light as compared with the SiOC film having the similar film thickness. As seen from a graph of the SiCN film of FIG. 26, permeability of the SiCN film with a thickness of about 30 nm is about 60%. Therefore, the SiCN film conceivably preferably has a thickness of not less than 30 nm in order to effectively suppress the permeation of ultraviolet light. Considering dielectric constant increases as the thickness of the SiCN film is larger, the SiCN film as the ultraviolet light permeation suppressive film conceivably preferably has a thickness of not more than 50 nm.

Figure 27:
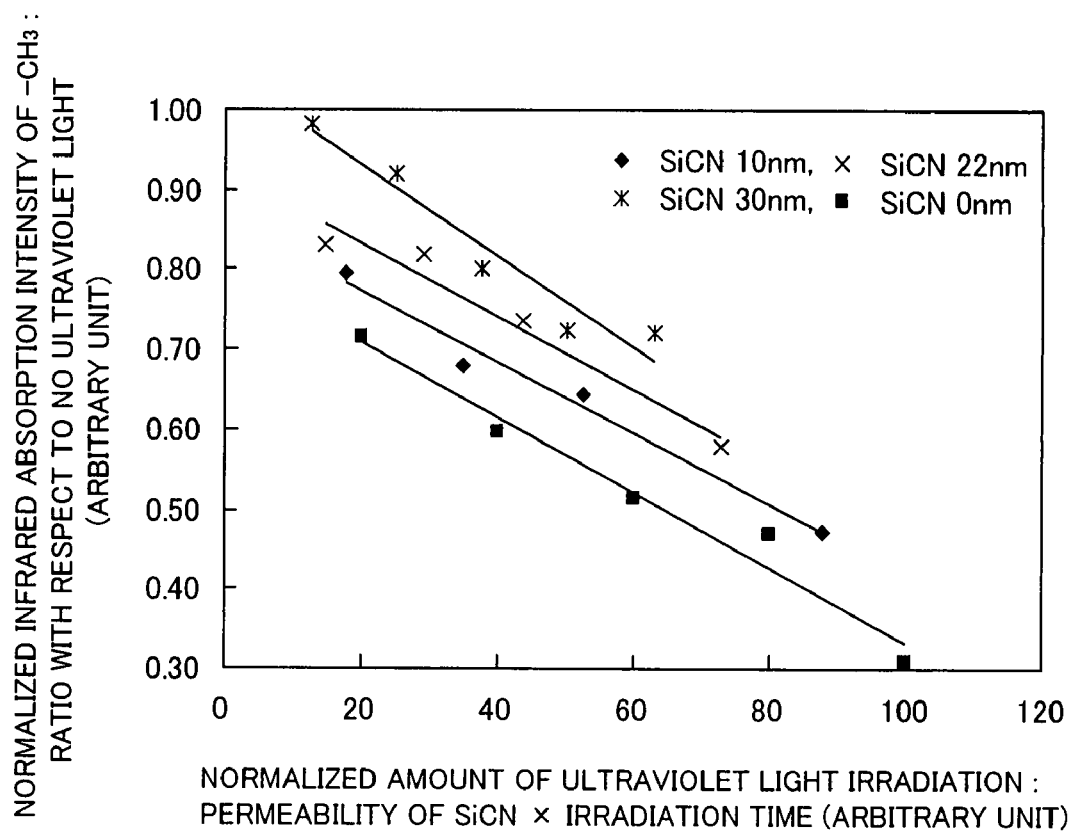
FIG. 27 is a graph showing relation between amounts of ultraviolet light irradiation in the SiOC films and infrared absorption intensities of —$CH_3$ groups.

FIG. 27 shows relation between the amount of ultraviolet light irradiation irradiated on the SiOC film and the rate of changes of the —$CH_3$ groups in the SiOC film. The amount of ultraviolet light irradiation irradiated on the SiOC film is calculated by normalizing the product of the thickness of the SiCN film and ultraviolet light irradiation time assuming that the product of a permeability when the thickness of the SiCN film is 0 nm and the irradiation time (10 minutes) of ultraviolet light is 100. The infrared absorption intensity of the —$CH_3$ groups in the SiOC film is also normalized assuming that the value when no ultraviolet light is irradiated is 1. FIG. 27 shows experimental results in case of four types of SiCN films having a thickness of 0 nm, about 10 nm, about 22 nm and about 30 nm respectively. Solid lines in FIG. 27 approximate the experimental results with respect to thicknesses of the respective SiCN films with straight lines. It is understood from FIG. 27 that the larger the thickness of the SiCN film, the larger the normalized infrared absorption intensity (axis of ordinate) of the —$CH_3$ group in the SiOC film, even when the amount of ultraviolet light irradiation (axis of abscissa) is the same. In other words, it has been proved that more —$CH_3$ groups remain in the SiOC film as the thickness of the SiCN film is larger even when the amount of ultraviolet light irradiation with respect to the SiOC film is the same. Focusing only on an ultraviolet light permeation suppressive function of the SiCN film, it is expected that the degree of the desorption of the —$CH_3$ groups is the same regardless of the thickness of the SiCN film when the amount of ultraviolet light irradiation to the SiOC film is the same. In this experiment, however, the larger the thickness of the SiCN film, the smaller the degree of the desorption of the —$CH_3$ groups. From this, the SiCN film conceivably has a function of inhibiting the —$CH_3$ groups desorbed from the SiOC film due to the influence of the ultraviolet light from diffusing as a gas from the SiOC film in addition to the function of suppressing the permeation of ultraviolet light and the gas diffusion suppressive effect is conceivably increased as the thickness of the SiCN film is increased.

Although the present invention has been described and illustrated in detail, it is clearly understood that the same is by way of illustration and example only and is not to be taken by way of limitation, the spirit and scope of the present invention being limited only by the terms of the appended claims.

For example, while the SiCN film is employed as the ultraviolet light permeation suppressive film in the aforementioned embodiments, the present invention is not restricted to this but any film other than the SiCN film may be alternatively employed as the ultraviolet light permeation suppressive film so far as it is a film composed of a material which is difficult to be permeable by ultraviolet light. For example, a SiC film or a SiN film may be employed.

While the wiring layer of Cu is employed as the wiring layer in the aforementioned embodiments, the present invention is not restricted to this but a wiring layer made of metal other than Cu may be alternatively employed.

While the SiOC film is employed as the organic film in the aforementioned embodiments, the present invention is not restricted to this but the organic film other than the SiOC film may be employed.

What is claimed is:

1. A semiconductor device comprising:
   an organic film formed on a semiconductor substrate, said organic film is a SiOC film having —$CH_3$ groups;
   an ultraviolet light permeation suppressive film, formed on a surface of said organic film, so as to be in contact with said organic film, wherein said ultraviolet light permeation suppressive film comprises SiCN, and has a thickness of not less than 30 nm and not more than 50 nm,
   wherein said ultraviolet light permeation suppressive film has a function of inhibiting hydrophobic groups degraded from said organic film;
   a first porous silica film formed on a surface of said ultraviolet light permeation suppressive film, so as to be in contact with said ultraviolet light permeation suppressive film,
   wherein a surface of said first porous silica film is covered with hydrophobic groups;
   an opening is formed through said organic film, said ultraviolet light permeation suppressive film, and said first porous silica film; and
   a barrier metal is formed so as to be in contact with an inner surface of said opening,
   said barrier metal is so formed as to cover a boundary between said semiconductor substrate and said organic film, a boundary between said organic film and said ultraviolet light permeation suppressive film, and a boundary between said ultraviolet light permeation suppressive film and said first porous silica film,
   wherein said barrier metal is a multilayer structure formed of a lower layer and an upper layer, and said lower layer and upper layer are formed of different materials,
   said lower layer and said upper layer of said barrier metal are formed on all over the inner surface of said opening, and
   a thickness of said barrier metal is substantially even; and
   a wiring layer formed at least inside said opening of said organic film under said ultraviolet light permeation suppressive film through said barrier metal by plating.

2. A semiconductor device according to claim 1, wherein said ultraviolet light permeation suppressive film includes a film suppressing permeation of a gas.

3. A semiconductor device according to claim 1, wherein the barrier metal is formed between said opening of said organic film and said wiring layer.

4. A semiconductor device according to claim 1, wherein said organic film formed under said ultraviolet light permeation suppressive film includes a second porous silica film and a cap film composed of SiOC, formed between said second porous silica film and said ultraviolet light permeation suppressive film.

5. A semiconductor device according to claim 1, wherein the thickness of said ultraviolet light permeation suppressive film is so formed as to be smaller than the thickness of said organic film and the thickness of said first porous silica film.

6. A semiconductor device according to claim 1, wherein said SiOC film is made from methyl silsesquioxane.

* * * * *

UNITED STATES PATENT AND TRADEMARK OFFICE
CERTIFICATE OF CORRECTION

| | | |
|---|---|---|
| PATENT NO. | : 8,384,208 B2 | Page 1 of 1 |
| APPLICATION NO. | : 11/826093 | |
| DATED | : February 26, 2013 | |
| INVENTOR(S) | : Shishida et al. | |

It is certified that error appears in the above-identified patent and that said Letters Patent is hereby corrected as shown below:

On the title page of the patent, under Item "(73) Assignee" please change "Sanyo Electric Co., Ltd., NEC Corporation and Rohn Co. Ltd." to -- Sanyo Electric Co., Ltd., NEC Corporation and Rohm Co. Ltd. --.

Signed and Sealed this
Twenty-second Day of October, 2013

Teresa Stanek Rea
*Deputy Director of the United States Patent and Trademark Office*